United States Patent
Karlsson et al.

(10) Patent No.: US 6,859,385 B2
(45) Date of Patent: Feb. 22, 2005

(54) LOW POWER SRAM

(75) Inventors: Magnus Karl-Olof Karlsson, Kungsangen (SE); Koen J. Weijand, Hellevoestsluis (NL); Tony Hans Ohlsson, Grillby (SE)

(73) Assignee: Zarlink Semiconductor AB, Jarfalla (SE)

( * ) Notice: Subject to any disclaimer, the term of this patent is extended or adjusted under 35 U.S.C. 154(b) by 21 days.

(21) Appl. No.: 10/341,133

(22) Filed: Jan. 13, 2003

(65) Prior Publication Data

US 2003/0169619 A1 Sep. 11, 2003

(30) Foreign Application Priority Data

Jan. 14, 2002 (GB) ................................................ 0200725

(51) Int. Cl.⁷ ................................................ G11C 11/00
(52) U.S. Cl. .............. 365/154; 365/189.05; 365/189.01
(58) Field of Search ........................... 365/154, 189.05, 365/189.01, 156, 149, 189.09

(56) References Cited

U.S. PATENT DOCUMENTS

| 4,441,169 | A |   | 4/1984  | Sasaki et al. |
| 4,750,155 | A |   | 6/1988  | Hsieh |
| 5,353,251 | A | * | 10/1994 | Uratani et al. ......... 365/189.05 |
| 5,831,896 | A |   | 11/1998 | Lattimore et al. |
| 5,844,836 | A | * | 12/1998 | Kepler et al. ................ 365/156 |
| 5,903,169 | A |   | 5/1999  | Kong |
| 6,212,094 | B1 | * | 4/2001  | Rimondi ...................... 365/156 |

FOREIGN PATENT DOCUMENTS

| DE | 3137902 A | 4/1983 |
| GB | 2062391 A | 5/1981 |
| GB | 2332967 A | 7/1999 |
| JP | 130179 A  | 5/1995 |

* cited by examiner

*Primary Examiner*—Michael S. Lebentritt
*Assistant Examiner*—N. Nguyen
(74) *Attorney, Agent, or Firm*—Lawrence E. Laubscher, Jr.

(57) ABSTRACT

An SRAM has a bit cell for storing a data bit in voltage mode at a data node, and a single bit line for respectively writing to and reading from said data node a data bit in reference current controlled mode. The SRAM has ultra low power consumption and can be used in word based SRAMs.

29 Claims, 3 Drawing Sheets

LOW POWER SRAM

BACKGROUND OF THE INVENTION

1. Field of the Invention

This invention relates to the field of random access memories, and in particular to a low power static random access memory SRAM.

2. Description of Related Art

In a computer, two types of main memory can be used to provide random access circuits, namely static random-access memory (SRAM) and dynamic random-access memory (DRAM). A single memory chip is made up of several million memory cells. In a SRAM chip, each memory cell typically consists of a single flip-flop (for storing the binary digits 1 or 0) and several transistors for the reading and writing operations. The access time of an SRAM chip is faster than a DRAM chip. SRAM chips are typically used in cache memory.

Current mode SRAMs designs, as the name would suggest, perform read-write operations in current mode during read and write operations and therefore consume less power than voltage mode devices.

Designers of prior art current mode SRAM architectures and implementations have traditionally focused on high speed, low power and low-voltage. Examples of such current-mode architectures are found in Wang et al., Low-Power Embedded SRAM Macros with Current-Mode Read/Write Operations, Proceedings ISLPED98, which purports to disclose a fully current-mode SRAM that uses 30% less power than an SRAM with only current-mode read operation; Khellah and Elmasry, Circuit techniques for High-Speed and Low-Power Multi-Port SRAMs, 1998 IEEE; and Wang and Lee, A New Current-Mode Sense Amplifier for Low-Voltage Low-Power SRAM Design, 1998 IEEE. The contents of these papers are incorporated herein by reference.

However, such designs use separate bitlines for read and write in combination with current mode read bitlines and are not capable of offering ultra low power consumption.

SUMMARY OF THE INVENTION

According to the present invention there is provided a static random access memory (SRAM) comprising a plurality of bit cells for storing data in voltage mode at a data node; and a single bit line for respectively reading and writing a data bit to said data nodes in reference current controlled mode.

The data is stored in voltage mode, but during reading and write operations the data is accessed in reference current controlled mode.

In a preferred embodiment, each bit cell comprises first and second inverters. The second inverter has a tristatable output connected to an input of the first inverter to define the data node.

The novel SRAM employs a single bitline for read/write operations. This can be made very low swing offering the potential for ultra low power consumption. The voltage of the bit line is maintained very close to one of the supply rails. The voltage swing is less than one half of the voltage threshold of the associated MOSFET. The SRAM is preferably word based and includes a sense amplifier/line driver word control cell and a bit cell. The use of a tristatable inverter, which goes into tristatable during a writing operation, means that a much lower current is needed to change the state of the cell. It permits a change of cell data with minimal current consumption.

The novel SRAM architecture and method of operation can be applied to both single port SRAMs and multiport SRAMs.

In preferred implementation the SRAM comprises an ultra low power current mode single bitline read/write RAM bit cell, and ultra low power RAM word control cell, and an ultra low power current mode single bitline detect and single bitline drive RAM read detector and write driver cell.

Typically, the SRAM has a plurality of bit cells selectable by a multiplexer tree, which is connected to a write driver circuit and a read detector. Advantageously, the read detector comprises a pair of current sources and a current conveyor. When a selected bit cell sources current, one of the current sources pulls the voltage at an output node up toward supply voltage.

The read/write selection is preferably performed with a selection transistor that when turned on is configured so that its gate voltage is approximately equal to its threshold voltage. Advantageously the selection transistor also acts as a birectional voltage-to-current converter.

The invention also provides a method of storing a data bit in a static random access memory having a plurality of bit cells, comprising storing data in voltage mode at data node in each bit cell, and respectively reading and writing a data bit to said data nodes in reference current controlled mode using a single bit line.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
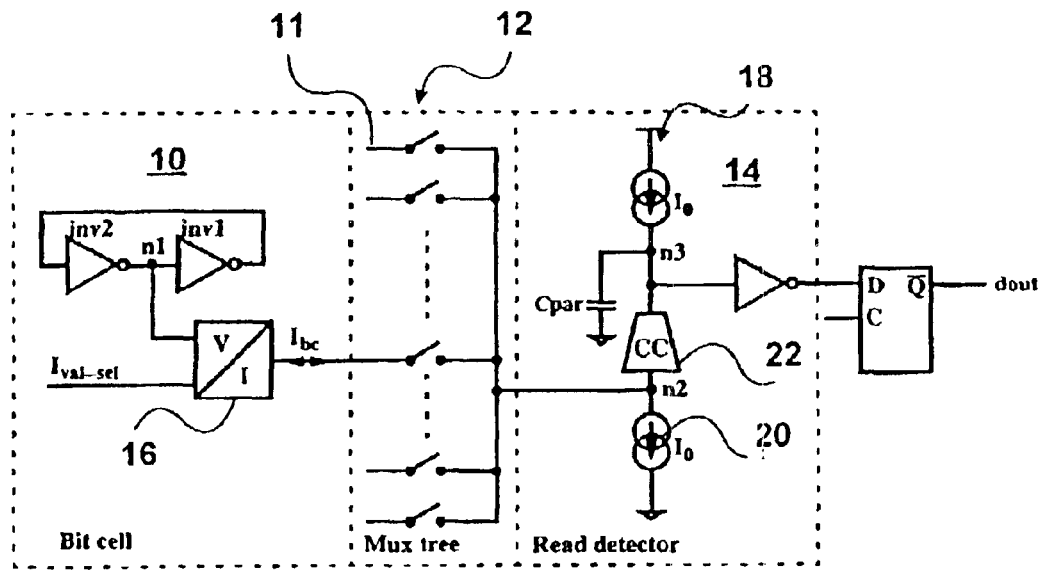
FIG. 1 is an equivalent diagram illustrating a read operation in an exemplary SRAM in accordance with the invention.
Figure 2:
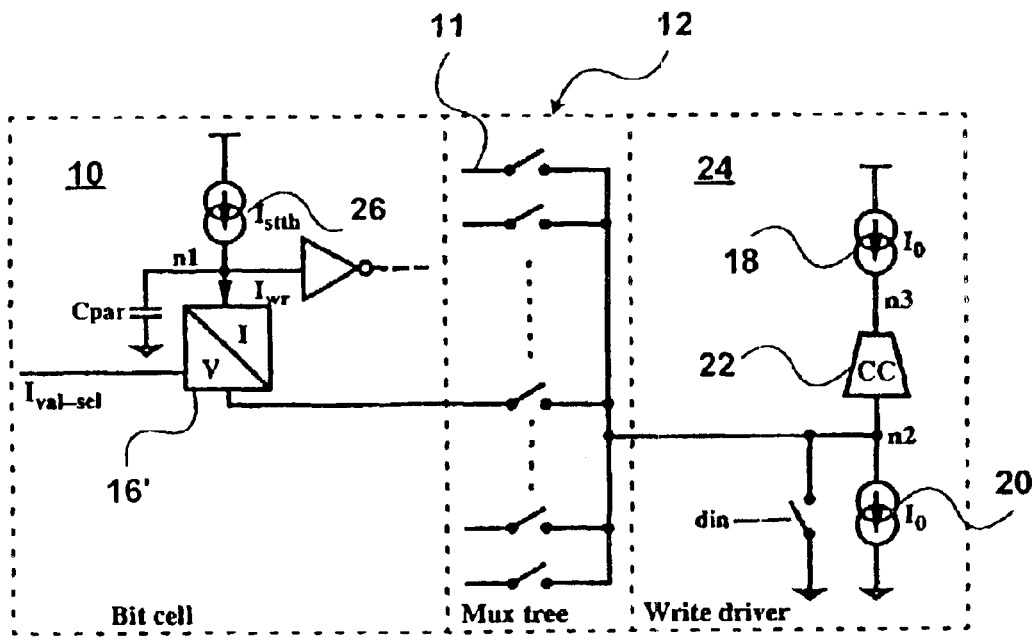
FIG. 2 is a diagram illustrating a write operation.

The principle of operation of an exemplary SRAM in accordance with the invention is shown in FIGS. 1 and 2. FIG. 1 shows a write operation and FIG. 2 shows a read operation.

FIG. 1 shows a bit cell 10, a Mux tree 12, and a read detector 14. Each demultiplexed line 11 is connected to a bit cell 10 so that the read detector 14 can be selectively connected through the Mux tree 12 to a selected bit cell.

The state of the bit cell 10 is defined by the node $n_1$ which controls the polarity of the voltage-to-current converter 16 and generates the bit cell state current ($Ibc$). The value of the bit cell state current $I_{bc}$ is set by the combined select and current level signal $I_{val-sel}$. The state current for the bit cell 10 is defined as $I_1$, flowing into the bit cell 10 and $I_2$ flowing out of the bit cell 10.

The bit cell current I affects the equilibrium of the read detector 14 such that if the bit cell 10 is sourcing current, the upper current source 18 will pull the output node $n_3$ up towards positive supply since the bit cell current applied to node $n_2$ will supply the current needed for the lower current source 20 and current conveyer 22 located between node $n_2$ and node $n_3$ sources the net current of the node $n_2$ into the node $n_3$. A current conveyor is described, for example, in the Wang article referred to above.

FIG. 2 illustrates the write mode principle of operation. The device is shown as having the bit cell 10, mux tree 12, and write driver 24. As in FIG. 1, the mux tree selects a bit cell into which it is desired to write data.

In FIG. 2, the bit cell 10 has a current source 26 generating a current $I_{stth}$ pulling node $n_1$ up towards positive supply with the current $I_{stth}$ where stth represents the state threshold for the bit cell 10. The voltage-to-current converter 16' has changed direction and is now directed towards the bit cell 10 rather than towards the mux tree 12. The output of the voltage-to-current converter 16, which will depend on a signal $d_{in}$ in the write driver, sinks a current $I_{WT}$ from the node $n_1$. The data is thus stored in voltage mode. Read and write operations occur in reference current controlled mode.

In the configuration shown in FIG. 2, if write signal din is high, the current $I_{WT}$ is greater than the current $I_{stth}$, and the node $n_1$ is low. If the write signal $d_{in}$ is low, the current $I_{WT}$ less than the current $I_{stth}$, and the node $n_1$ is high, or in other words if $d_{in}$=High $I_{WT}>I_{stth}$ and $n_1$=Low else if $d_{in}$= Low $I_{WT}<I_{stth}$ and $n_1$=High. It will be seen that the stored data value is the inverse of the actual data value determined by the input signal $d_{in}$.

Figure 3:
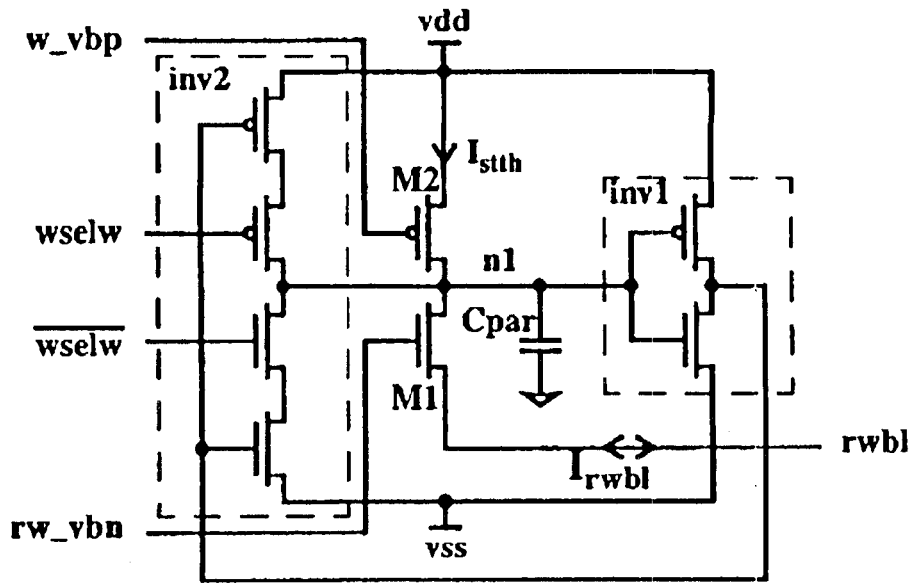
FIG. 3 illustrates an ultra low power current mode single bit line read/write RAM bit cell.
Figure 4:
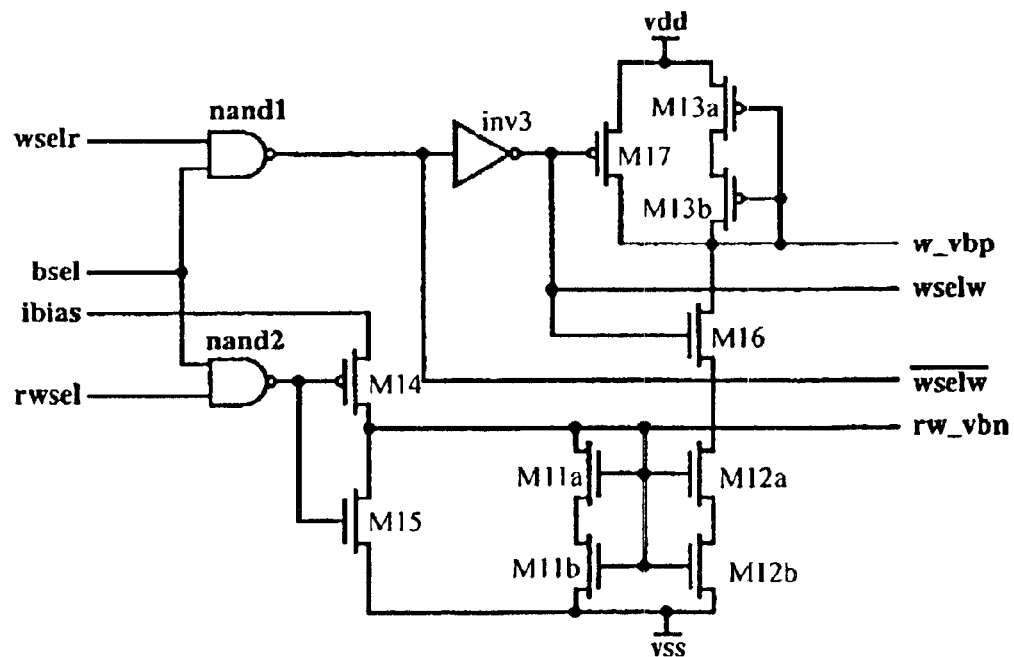
FIG. 4 illustrates an ultra low power RAM word control cell RAM word control cell for the SRAM.
Figure 5:
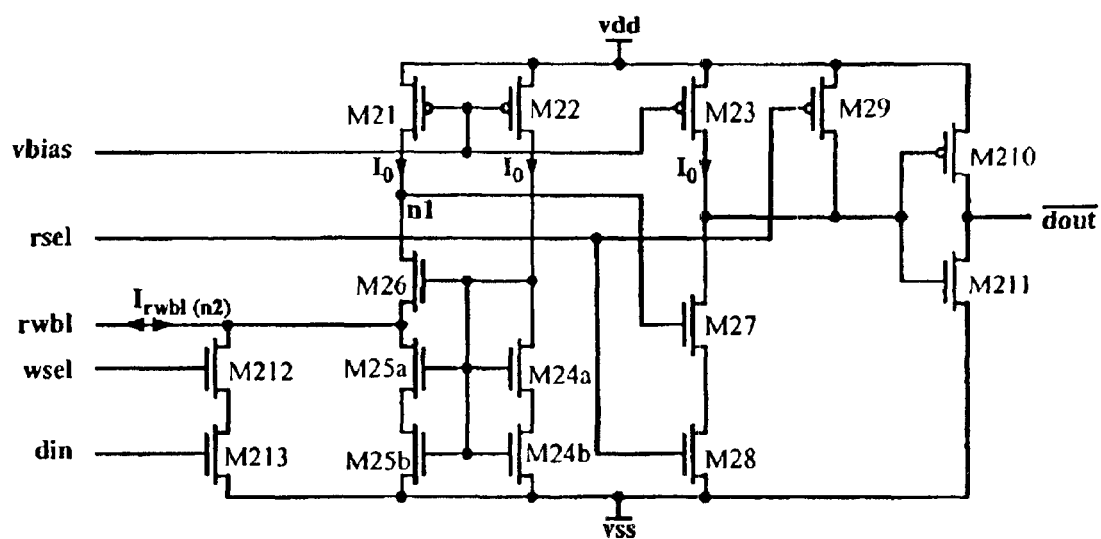
FIG. 5 illustrates an ultra low power RAM read detector write driver cell for the SRAM.

The preferred practical Implementation of the invention comprises three different parts, namely an ultra low power current mode single bitline read/write RAM bit cell shown in FIG. 3, an ultra low power RAM word control cell shown in FIG. 4 and an ultra low power current mode single bitline detect and single bitline drive RAM read detector and write driver cell shown in FIG. 5.

The ultra low power current mode single bit fine read/write RAM bit cell shown in FIG. 3 comprises two CMOS inverters, namely one ordinary two transistor inverter inv1 and a second tristatable four transistor inverter inv2. This goes into tristate during write operations and thus enables a much lower current to change the state of the cell. The inverters inv1 and inv 2 are configured such that the output of inyl is connected to the input of inv2 and the output of inv2 is connected to the input of inv1.

The bit line has a very line swing. It is typically maintained a voltage close to one of the power rails and has a voltage swing less than one half of the threshold voltage $V_t$ of the associated MOSFET.

Transistor M1 acts a bidirectional bitselect/pass transistor and also as a voltage-to-current converter connecting the read/write bitline rwbl into the cell and particularly to the node $n_1$, which defines the state of the cell.

During write operation, if the word in which the bit cell is located is selected, inverter inv2 is turned off by signals wctrl and the wctrib. Transistor M2 is weakly turned on, vgs~Vt, (gate voltage approximately equals threshold voltage) and therefore sources a current $I_{stth}$, where stth= state threshold, to node $n_1$. The gate voltage Vgs is a therefore reference current controlled voltage.

The transistor M1 is also weakly turned on, vgs~Vt, and sinks either a large current $I_{1set}$, which is greater than the current $I_{stth}$, or a low current $I_{0set}$, which is less than the current $I_{stth}$, depending on the data to be written to the cell.

Depending on the current through the transistor M1, the node $n_1$ Is forced either low ($I_{1set}$) or high ($I_{0set}$). When the inverter inv2 is again turned on and the transistors M1 and M2 are turned off, the inverters inv1 and inv2 latch the new value for node $n_1$ since the inverter inv2 is forced to the state of node $n_1$ by the inverter inv1.

The capacitance $C_{par}$ for the node $n_1$ holds the new value for the node $n_1$ during control signal switching. To achieve a correct write function, the current rwbl through the transistor M1 should be approximately equal to two times the current $I_{stth}$(Irwbl~2*$I_{stth}$) The required ratio between $I_{stth}$ and $I_{rwbl}$ is achieved by appropriate scaling of the transistors M1 and M2 together with the appropriate setting of the voltages w__vbp and rw__vbn.

The described device uses a very low supply current due to the fact that there is no drain of crowbar currents when writing a new state into the cell and the small voltage swings on the bitlines as a result of the current mode operation.

During a read operation and if the word in which the bit cell 10 is located is selected, the transistor M1 is weakly turned on, vgs~Vt, and hence opens a path through to the signal line rwbl for the positive or negative current, which is dependent on the state of the cell, from the inverter inv2 output to the read detector 14.

The ultra low power RAM word control cell is shown in FIG. 4. This provides the bias voltages necessary for the bit cell read and write function and also acts as a cross point for row select signals (wselr and rwsel), bank select signal (bsel) and the word bias current (ibias) which is routed through the bank select network.

The transistors M11 (M11a, M11b) and Ml2 (Ml2a, Ml2b) form a current mirror, both generating the signal rw__vbn, which is equal to Vvss+Vtn+Veffn, from the diode connected transistor M11 and a bias current for the diode connected transistor M13 (Ml3a, M13b), which generates the signal w__vbp. This is equal to Vvdd-Vtp-Veffp. The transistors M14 to M17 are switches which turn the current mirrors on and off.

During a RAM word write operation, if the row and the bank are selected, the signals wselr (tailing r for row), rwsel and bsel are high and a source current flows into the ibias signal source, namely transistor M14. The signal wselw (tailing w for word) is high and turns the tristatable inverters of the bit cells in the selected word off. The signals w__vbp and rw__vbn become active and hence turn on the current sources and current conveyers in the bit cells. To achieve a correct write function of the bit cells, the appropriate values of the w__vbp and rw__vbn voltages are set by proper scaling of the transistors M11a, M11b; M12a, M12b; and M13a, M13b. The tristatable inverters are placed in a tristate during a write operation. This helps to keep current consumption to an absolute minimum.

During RAM word read operation, if the row and the bank are selected rwsel is high and a sourcing current flows into the ibias signal line. The rw__vbn signal becomes active, turning on the current conveyers for the bit cells.

The ultra low power read detector and write driver is shown in FIG. 5. The transistors M21, M22 and M23 act as current sources biased by the signal vbias and source the current $I_0$. The transistors M21 and M22 source the currents into the current mirror formed by transistors M24, M25 and M26, which acts as the current conveyer. The rwbl node acts as a current summing node. The transistors M28, M29 and M212 are control switches controlling read and write operation.

During a write operation the signal wsel is high, turning on the switch transistor M212 and making vbias active, causing the three $I_0$ currents to be sourced into the current mirror consisting of transistors M24 to M26 and inverter M27. The inverter M27 is inactive due to the fact that the switch M28 is off and the switch M29 defines the signal $d_{out}$ as being the inverse of a low state due to the fact that the signal line rsel is low.

The writing of the selected bit cell is done by either not pulling any current through rwbl, wherein $d_{in}$ is low "0" and M213 is turned off, or pulling a large current through rwbl, wherein $d_{in}$ is high "1" and M213 is turned on.

During a read operation rsel is high, which turns on the switch transistor M28 and turns off the switch M29, hence making the inverter M27 active. The signal vbias is active, causing the three $I_0$ currents to be sourced into the current mirror transistors M24 to M26 and inverter M27. The switch transistor M212 is off due to the fact that wsel is low.

If input current iin is positive, sourcing current into the current summing node, the current through transistor M6 will decrease respectively making $Idsm_{M6} < I_0$ and hence the difference current will pull the node $n_1$ towards the positive supply, causing the inverter M27 output to go low and hence the $d_{out}$ inverse output to go a high state, indicating a detected "0".

If iin is negative, pulling current through rwbl, the current through M6 will increase respectively making $Ids_{M6} < I_0$ to and hence the difference current will pull node $n_1$ towards negative supply causing the inverter M27 output to go high and hence the $d_{out}$ inverse output to low state, indicating a detected "1".

The described SRAM can be made to have ultra low power consumption or run at very high speed. It is also fully scaleable and thus has a broad range of uses. It uses single bit line current mode read and write SRAM architecture with bias current controlled speed and supply current dissipation.

The bit line has very low swing signaling, being Vdsat of an nmos transistor. The gate drive voltage of the selection transistors is close to the threshold voltage Vt. The selection transistor also acts as a controlled bidirectional voltage to current converter. Word selection is also done in the current mode. The SRAM can be used in both single port and multi-port configurations.

We claim:

1. A static random access memory, comprising
a plurality of bit cells for storing a data bit in voltage mode at a data node, wherein each bit cell comprises first and second inverters, and said second inverter has a tristatable output connected to an input of said first inverter to define said data node; and
a single bit line for respectively reading and writing a data bit to said data nodes in a reference current controlled mode.

2. A static random access memory as claimed in claim 1, wherein said inverters comprise CMOS transistors.

3. A static random access memory comprising
a plurality of bit cells for storing a data bit in voltage mode at a data node; and
a single bit line for respectively reading and writing a data bit to said data nodes in a reference current controlled mode, wherein said single bit line is a low swing bit line such that said bit line stays at a voltage that is close to one power supply rail and said swing is less than one half the threshold voltage of an associated MOSFET.

4. A static random access memory as claimed in claim 3, further comprising a selection transistor through which said single bit line accesses said data node, said transistor being configured to be weakly turned on during read and write operations.

5. A static random access memory as claimed in claim 4, wherein said selection transistor is a field effect transistor configured such that during read and write operations its gate voltage is approximately equal to its threshold voltage and said gate voltage is a reference current controlled gate voltage.

6. A static random access memory as claimed in claim 5, wherein said selection transistor is a CMOS transistor.

7. A static random access memory as claimed in claim 4, wherein said selection transistor is configured to act also as a bidirectional voltage-to-current converter for said current mode bit cell.

8. A static random access memory as claimed in claim 4, further comprising a current supply transistor connected to said data node, said current supply transistor being configured to be weakly turned on during a write operation.

9. A static random access memory as claimed in claim 8, further comprising a word control cell comprising a pair of transistors forming a current mirror, both said transistors generating a row select signal for said selection transistor.

10. A static random access memory as claimed in claim 9, wherein said word control cell further comprises a further transistor for generating a control signal for said currently supply transistor.

11. A static random access memory as claimed in claim 10, wherein said pair of transistors also generates a bias current for said further transistor.

12. A static random access memory as claimed in claim 11, further comprising additional transistors for turning said pair of transistors forming said current mirror on and off according to select signals.

13. A static random access memory as claimed in claim 9, further comprising a read detector having an output node, an intermediate node connected to said bit cell, and a current source for said output node, wherein when said bit cell sources current to said intermediate node said current source pulls said output node up toward supply voltage.

14. A static random access memory as claimed in claim 13, further comprising a second current source supplied by said intermediate node and a current conveyor connected between said intermediate node and said output node.

15. A static random access memory as claimed in claim 14, wherein said current conveyor comprises transistors arranged as a current mirror.

16. A static random access memory as claimed in claim 13, further comprising a write driver which comprises a signal line connected to said intermediate node.

17. A static random access memory as claimed in claim 13, further comprising a multiplexer tree for selecting one of said bit cells for read and write operations.

18. A method of storing a data bit in a static random access memory having a plurality of bit cells, comprising:
storing data in voltage mode at a data node in each bit cell, wherein said bit cell comprises first and second inverters, said second inverter has a tristatable output connected to an input of said first inverter to define said data node and minimize current consumption during a change of state of said cell, and said cell goes into a tristate during a writing operation; and
respectively reading and writing a data bit to said data nodes in reference current controlled mode using a single bit line.

19. A method as claimed in claim 18, wherein during a read operation if the bit cell sources a current, a first current source pulls an output node toward supply voltage.

20. A method as claimed in claim 19, wherein the bit cell supplies current, a current conveyor transfers current to said output node, and said bit cell supplies current to a second current source in series with said first current source and said current conveyor.

21. A method as claimed in claim 20, wherein said current conveyor is implemented as a current minor.

22. A method as claimed in claim 21, wherein during a read operation a switch connects a signal input to said intermediate node.

23. A method as claimed in claim 18, wherein word selection is also carried out in current mode.

24. A method of storing a data bit in a static random access memory having a plurality of bit cells, comprising:
   storing data in voltage mode at a data node in each bit cell; and
   respectively reading and writing a data bit to said data nodes in reference current controlled mode using a single bit line, wherein said single bit line only swings over a low range that is close to one power supply rail and said swing is less than one half the threshold voltage of an associated MOSFET.

25. A method as claimed in claim 24, wherein said single bit line is accessed through a selection transistor that is weakly turned on during read and write operations.

26. A method as claimed in claim 25, wherein said selection transistor is a field effect transistor, and during read and write operations its gate voltage is approximately equal to its threshold voltage and said gate voltage is generated in a reference current controlled manner.

27. A method as claimed in claim 26, wherein said selection transistor also acts as a bidirectional voltage-to-current converter for said current mode bit cell.

28. A method as of aimed in claim 27, wherein current is supplied to said data node through a current supply transistor that is weakly turned on during a write operation.

29. A method as claimed in claim 24, wherein the speed of operation of said memory and supply current dissipation is controlled by a bias current.

* * * * *